US008755757B2

(12) United States Patent
Yamamoto

(10) Patent No.: US 8,755,757 B2

(45) Date of Patent: Jun. 17, 2014

(54) AMPLIFIER APPARATUS, RADIO TRANSMITTING APPARATUS INCLUDING SAME, AND METHOD OF ADJUSTING GAIN OF AMPLIFIER APPARATUS

(75) Inventor: Takashi Yamamoto, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 31 days.

(21) Appl. No.: 13/519,196

(22) PCT Filed: Jan. 20, 2011

(86) PCT No.: PCT/JP2011/050943

§ 371 (c)(1), (2), (4) Date: Jun. 26, 2012

(87) PCT Pub. No.: WO2011/102177

PCT Pub. Date: Aug. 25, 2011

(65) Prior Publication Data

US 2012/0286867 A1 Nov. 15, 2012

(30) Foreign Application Priority Data

Feb. 16, 2010 (JP) ................................ 2010-031630

(51) Int. Cl.
*H04B 1/04* (2006.01)
*H04L 25/03* (2006.01)

(52) U.S. Cl.
USPC ....................................... 455/114.3; 375/296

(58) Field of Classification Search
USPC ......... 455/114.2, 114.3, 115.1; 375/295, 296, 375/284, 285; 330/149, 136
See application file for complete search history.

(56) References Cited

U.S. PATENT DOCUMENTS 6,342,810 B1 * 1/2002 Wright et al. .................. 330/51
6,388,513 B1 * 5/2002 Wright et al. .................... 330/2

(Continued)

FOREIGN PATENT DOCUMENTS

EP 1 681 771 A1 7/2006
JP 9-261292 10/1997

(Continued)

OTHER PUBLICATIONS

Lei Ding, "Digital Predistortion of Power Amplifiers for Wireless Applications," School of Electrical and Computer Engineering,Georgia Institute of Technology, Mar. 2004, pp. 1-103.

*Primary Examiner* — Sonny Trinh

(74) *Attorney, Agent, or Firm* — Drinker Biddle & Reath LLP

(57) ABSTRACT

An object of the present invention is to provide an amplifier apparatus 1 in which even if a gain of a returning analog circuit 4 fluctuates, the fluctuation in the gain can be corrected, making it possible to accurately perform a distortion compensation process by a DPD 20. The present invention relates to an amplifier apparatus 1 including an amplifier 11 and a digital pre-distorter (DPD) 20 that performs a distortion compensation process of the amplifier 11. The amplifier apparatus 1 includes a transmitting analog circuit 3 including the amplifier 11; a returning analog circuit 4 including an attenuator 15; a power measurement circuit 16 that measures output power of the amplifier 11; and an amount-of-change calculating unit 27 that calculates an amount of change ΔGrx in a gain Grx of the returning analog circuit 4, based on a measured value of the power measurement circuit 16.

11 Claims, 9 Drawing Sheets

FRAME TIMING SIGNAL
TRANSMIT SIGNAL
DSP
DPD
DAC
LPF
FIRST FREQUENCY CONVERTING UNIT
HPA
COUPLER
ADC
LPF
SECOND FREQUENCY CONVERTING UNIT
ATT
ADC
AD8362
2
3
4
5
6
8
9
10
11
12
13
14
15
16
16A
16B
20

(56) References Cited

U.S. PATENT DOCUMENTS

| | | | | |
|---|---|---|---|---|
| 6,853,246 | B2 * | 2/2005 | Bauder et al. | 330/149 |
| 7,034,612 | B2 * | 4/2006 | Kim | 330/149 |
| 7,042,283 | B2 * | 5/2006 | Suzuki et al. | 330/52 |
| 7,330,517 | B2 * | 2/2008 | Taler et al. | 375/297 |
| 2004/0246048 | A1 | 12/2004 | Leyonhjelm et al. | |
| 2006/0270365 | A1 | 11/2006 | Kehlenbach | |

FOREIGN PATENT DOCUMENTS

| | | | |
|---|---|---|---|
| JP | 2000-78036 | | 3/2000 |
| JP | 2001-57522 | | 2/2001 |
| JP | 2004-032252 | A | 1/2004 |
| JP | 2004-187153 | | 7/2004 |
| JP | 2007-221244 | | 8/2007 |
| JP | 2009-010515 | A | 1/2009 |

* cited by examiner

20
FRAME TIMING SIGNAL
FROM DETECTOR CIRCUIT
TIMING INFORMATION GENERATING UNIT
26
$T_P$ : PREAMBLE PERIOD
$T_P$
27
AMOUNT-OF-CHANGE CALCULATING UNIT
ΔGrx
25
DISTORTION COMPENSATING UNIT
ai'
24
MODEL ESTIMATING UNIT
DIGITAL TRANSMIT SIGNAL
x
y
TO DAC
z
FROM ADC
21
TRANSMIT SIGNAL BUFFER
22
RETURN SIGNAL BUFFER
23
TIMING SYNCHRONIZING UNIT

| | DIGITAL TRANSMIT POWER Ptx | DIGITAL RETURN POWER Prx | TARGET VALUE Trx OF DIGITAL RETURN POWER | TRANSMIT POWER Pout (TARGET VALUE : Tout) |
|---|---|---|---|---|
| INITIAL STATE | Tout-Gtx | Tout+Grx | Tout+Grx | Tout |

| | Ptx | Prx | Trx | Pout |
|---|---|---|---|---|
| INITIAL STATE | Tout−Gtx | Tout+Grx | Tout+Grx | Tout |
| FLUCTUATION IN TRANSMIT GAIN | Tout−Gtx | Tout+ΔGtx+Grx | Tout+Grx | Tout+ΔGtx |
| AFTER DPD | Tout−Gtx−ΔGtx | Tout+Grx | Tout+Grx | Tout |

| | Ptx | Prx | Trx | Pout |
|---|---|---|---|---|
| INITIAL STATE | Tout-Gtx | Tout+Grx | Tout+Grx | Tout |
| AFTER FLUCTUATION IN GAIN | Tout-Gtx | Tout+ΔGtx+ Grx+ΔGrx | Tout+Grx | Tout+ΔGtx |
| AFTER DPD | Tout-Gtx- ΔGtx-ΔGrx | Tout+Grx | Tout+Grx | Tout-ΔGrx |

FIG. 7

| | Ptx | Prx | Trx | Pout |
|---|---|---|---|---|
| INITIAL STATE | Tout−Gtx | Tout+Grx | Tout+Grx | Tout |
| AFTER CHANGE IN GAIN | Tout−Gtx | Tout+ΔGtx+Grx+ΔGrx | Tout+Grx | Tout+ΔGtx |
| DPD: FIRST TIME | Tout−Gtx−ΔGtx−ΔGrx | Tout+Grx | Tout+Grx | Tout−ΔGrx |
| DETECTION PROCESS + MODIFICATION OF Trx | Tout−Gtx−ΔGtx−ΔGrx | Tout+Grx | Tout+Grx+ΔGrx | Tout−ΔGrx |
| DPD: SECOND TIME | Tout−Gtx−ΔGtx | Tout+Grx+ΔGrx | Tout+Grx+ΔGrx | Tout |

20
FROM DETECTOR CIRCUIT
AMOUNT-OF-CHANGE CALCULATING UNIT
27
ΔGrx
DISTORTION COMPENSATING UNIT
25
ai'
MODEL ESTIMATING UNIT
24
TIMING INFORMATION GENERATING UNIT
26
Tc
Tc : CAPTURE PERIOD
TIMING SYNCHRONIZING UNIT
23
TRANSMIT SIGNAL BUFFER
21
RETURN SIGNAL BUFFER
22
y
TO DAC
z
FROM ADC
x
DIGITAL TRANSMIT SIGNAL
FRAME TIMING SIGNAL 6
5
COUPLER
16
11
HPA
ATT
15
10
FIRST FREQUENCY CONVERTING UNIT
SECOND FREQUENCY CONVERTING UNIT
14
AD8362
16A
9
LPF
LPF
13
3
4
8
DAC
ADC
12
ADC
16B
2
DPD
20
30
GAIN CORRECTING UNIT
TEMPERATURE SENSOR
31
DSP
FRAME TIMING SIGNAL
TRANSMIT SIGNAL
USED FREQUENCY

AMPLIFIER APPARATUS, RADIO TRANSMITTING APPARATUS INCLUDING SAME, AND METHOD OF ADJUSTING GAIN OF AMPLIFIER APPARATUS

TECHNICAL FIELD

The present invention relates to an amplifier apparatus having a Digital Pre-Distorter (which hereinafter may be abbreviated as "DPD") and a radio transmitting apparatus including the amplifier apparatus. More specifically, the present invention relates to a method of adjusting the gain of the amplifier apparatus.

BACKGROUND ART

For example, in a digital radio communication device, in order to prevent adjacent-channel interference caused by higher-order distortion of a power amplifier, the linearity of the input and output amplitude characteristics of the amplifier is strictly required. However, it is difficult to achieve both high power and an increase in efficiency while maintaining excellent linearity.

Hence, to achieve an improvement in power efficiency while ensuring the linearity of the input-output characteristics of the power amplifier, there are proposed various distortion compensation schemes to compensate for distortion occurring in a nonlinear region. For such distortion compensation schemes, there are broadly a feedforward scheme, a feedback scheme, and a pre-distortion scheme.

Of them, the pre-distortion scheme adds a characteristic inverse to the distortion characteristic of an input signal to the power amplifier to the input signal in advance, and thereby obtains an output signal from the power amplifier in a "no distortion" or "very little distortion" state.

For a distortion compensation circuit of such a pre-distortion scheme, there are a scheme (LUT scheme) in which, for example, as shown in Non Patent Literature 1, the amount of correction is stored in an LUT (Look Up Table) and is sequentially modified using the difference between an output signal from the amplifier and a target output signal; and a scheme (polynomial approximation scheme) that performs adaptive control by approximating the amount of correction for the amplifier by a polynomial and computing the coefficient values thereof using an output signal and an input signal from/to the amplifier.

CITATION LIST

Non Patent Literature

Non Patent Literature 1: Thesis by Lei Ding, "Digital predistortion of power amplifiers for wireless application", Georgia institute of Technology, March 2004

SUMMARY OF INVENTION

Technical Problem

An amplifier apparatus adopting a digital pre-distorter (DPD) of the above-described polynomial approximation scheme normally includes, at a subsequent stage to the DPD, a transmitting analog circuit that converts a digital transmit signal outputted from the DPD to an analog signal, up-converts the analog signal, and amplifies the analog signal; and a returning analog circuit that adjusts an output signal from an amplifier included in the transmitting analog circuit to a predetermined amplitude, and down-converts the signal, converts the signal to a digital signal, and inputs the digital signal to the DPD (see, for example, (a) of FIG. 3).

The returning analog circuit is disposed between the DPD and a coupler in order to feed back an analog output signal from the amplifier which is extracted by the coupler, to the DPD as a digital signal. The returning analog circuit mainly includes an attenuator that adjusts the analog output signal from the amplifier to a predetermined amplitude; a frequency converting unit for converting from a carrier frequency to a baseband; and an A/D converter.

Then, the DPD obtains the analog output signal from the power amplifier through the returning analog circuit, as a baseband digital signal.

Meanwhile, although the gains of the transmitting analog circuit and the returning analog circuit fluctuate due to deterioration over time or changes in temperature, the fluctuation in the gain of the transmitting analog circuit can be erased by a distortion compensation process by the DPD.

However, the fluctuation in the gain of the returning analog circuit cannot be erased only by a distortion compensation process by the DPD. Thus, if fluctuation in gain occurs in the circuit, then there is a problem that a distortion compensation process by the DPD cannot be accurately performed.

In view of the above-described conventional problem, an object of the present invention is to provide an amplifier apparatus, etc., in which even if the gain of a returning analog circuit fluctuates, the fluctuation in gain can be corrected, making it possible to accurately perform a distortion compensation process by a DPD.

Solution to Problem (1) The present invention provides an amplifier apparatus including an amplifier and a DPD that performs a distortion compensation process of the amplifier, the amplifier apparatus including: a transmitting analog circuit that converts a digital output signal from the DPD to an analog signal, up-converts the analog signal, and inputs the analog signal to the amplifier, the transmitting analog circuit including the amplifier; a returning analog circuit that adjusts an analog output signal from the amplifier to a predetermined amplitude, down-converts the analog output signal to a digital signal, and inputs the digital signal to the DPD; a power measurement circuit that measures output power of the amplifier; and an amount-of-change calculating unit that calculates an amount of change in a gain of the returning analog circuit, based on a measured value of the power measurement circuit.

According to the amplifier apparatus of the present invention, since the amount-of-change calculating unit calculates the amount of change in the gain of the returning analog circuit, based on a measured value of the power measurement circuit, the gain of the returning analog circuit can be corrected using the calculated amount of change.

Hence, even if the gain of the returning analog circuit fluctuates due to deterioration over time or changes in temperature, a distortion compensation process by the DPD can be accurately performed by correcting the gain of the returning analog circuit using the calculated amount of change.

Note that the power measurement circuit can be constituted by, for example, a detector circuit (power detector) that detects an analog output signal (RF signal) from the amplifier.

(2) In the amplifier apparatus of the present invention, it is preferred that the DPD erase an amount of change in a gain of the transmitting analog circuit by a first distortion compensation process and then correct, by a second distortion compensation process taking into account an amount of change in a gain of the returning analog circuit, the gain.

In this case, even if there is gain fluctuation in both of the analog circuits, the gains can be corrected by distortion compensation processes by the DPD.

(3) Furthermore, in the amplifier apparatus of the present invention, it is preferred that the amount-of-change calculating unit calculate the amount of change in the gain of the returning analog circuit, using a measured value of the power measurement circuit for a known signal pattern.

By doing so, a measured value of the power measurement circuit is stabilized and thus the amount of change in the gain of the returning analog circuit can be accurately calculated.

(4) Furthermore, in the amplifier apparatus of the present invention, by allowing the amount-of-change calculating unit to perform an averaging process of measured values of the power measurement circuit during a period during which the known signal pattern is transmitted, noise measurement error is suppressed, making it possible to more accurately calculate the amount of change in the gain of the returning analog circuit.

(5) In addition, in this case, by allowing the amount-of-change calculating unit to perform the averaging process over periods during which signal patterns of a plurality of transmit frames are transmitted, noise measurement error can be more securely suppressed over the case of performing an averaging process during a period during which a signal pattern of a single transmit frame is transmitted, and thus, the amount of change in the gain of the returning analog circuit can be more accurately calculated.

(6) In the amplifier apparatus of the present invention, the amount-of-change calculating unit may calculate the amount of change in the gain of the returning analog circuit, using a measured value of the power measurement circuit for a capture signal whose maximum amplitude is greater than or equal to a predetermined value, the capture signal being captured during a predetermined sampling period.

In this case, since a process of correcting a return gain can be performed even without using a known signal pattern such as a preamble portion, the present invention can also be applied to a transmitting apparatus compliant with a standard that does not include a preamble portion.

(7) Further, it is preferred that the amplifier apparatus of the present invention further include a gain correcting unit that correct a gain of the power measurement circuit, based on either or both of an ambient temperature of the power measurement circuit and a used frequency of a transmit signal.

In this case, even if the ambient temperature or the used frequency fluctuates, a measured value of the power measurement circuit can be maintained with high accuracy and thus a process of correcting the gain of the returning analog circuit can be accurately performed.

(8) A radio transmitting apparatus of the present invention is a radio transmitting apparatus including the amplifier apparatus of the present invention, and provides the same functions and effects as those of the amplifier apparatus of the present invention.

(9) A method of the present invention includes the steps of; measuring output power of an amplifier; calculating an amount of change in a gain of a returning analog circuit disposed at a subsequent stage to the DPD, based on the measured output power of the amplifier; and correcting the gain of the returning analog circuit, based on the calculated amount of change.

According to the method of the present invention, the amount of change in the gain of the returning analog circuit disposed at a subsequent stage to the DPD is calculated based on the measured output power of the amplifier, and the gain of the returning analog circuit is corrected based on the calculated amount of change. Thus, even if the gain of the returning analog circuit fluctuates due to deterioration over time or changes in temperature, a distortion compensation process by the DPD can be accurately performed.

Advantageous Effects of Invention

As described above, according to the present invention, even if the gain of the returning analog circuit fluctuates, the fluctuation in gain can be corrected and thus a distortion compensation process by the DPD can be accurately performed.

Figures 3A, 3B:
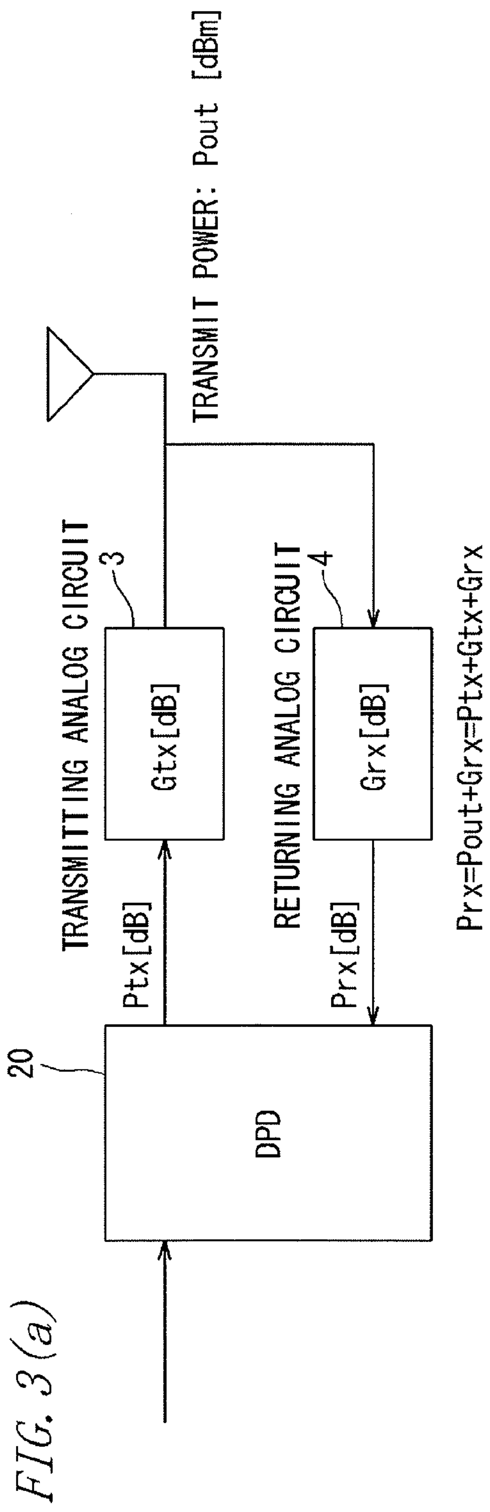

(a) of FIG. 3 is a functional block diagram of the amplifier apparatus for showing power control performed by the DPD, and (b) of FIG. 3 is a table showing each power in an initial state with no fluctuation in gain.

Figures 4A, 4B:
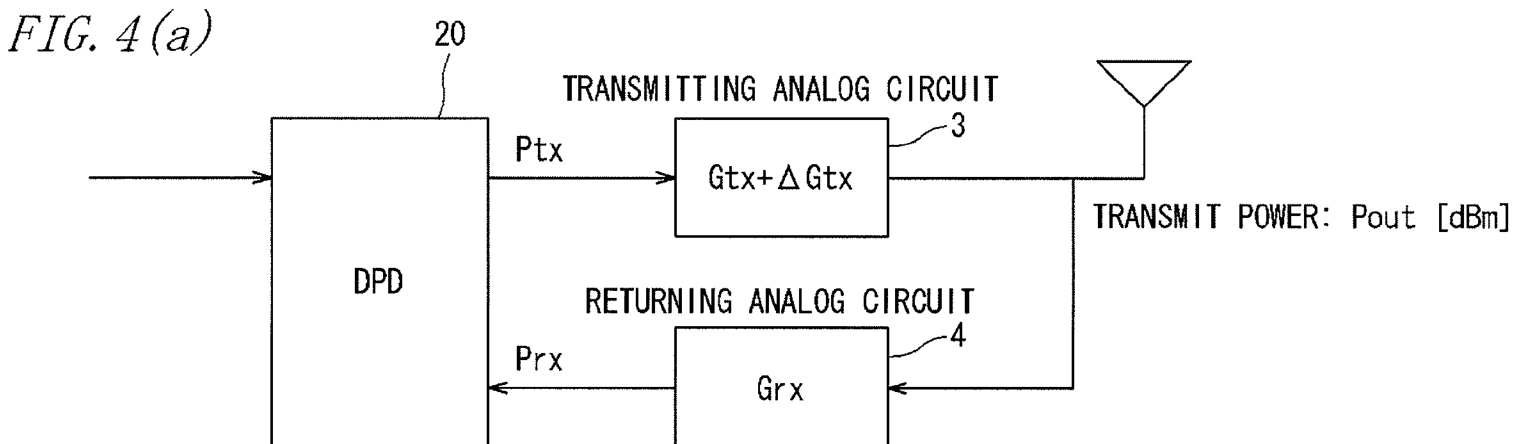

(a) of FIG. 4 is a functional block diagram of the amplifier apparatus for when the gain of a transmitting analog circuit is changed, and (b) of FIG. 4 is a table showing each power for when there is the change in gain and each power for when a distortion compensation process is performed once.

Figures 5A, 5B:
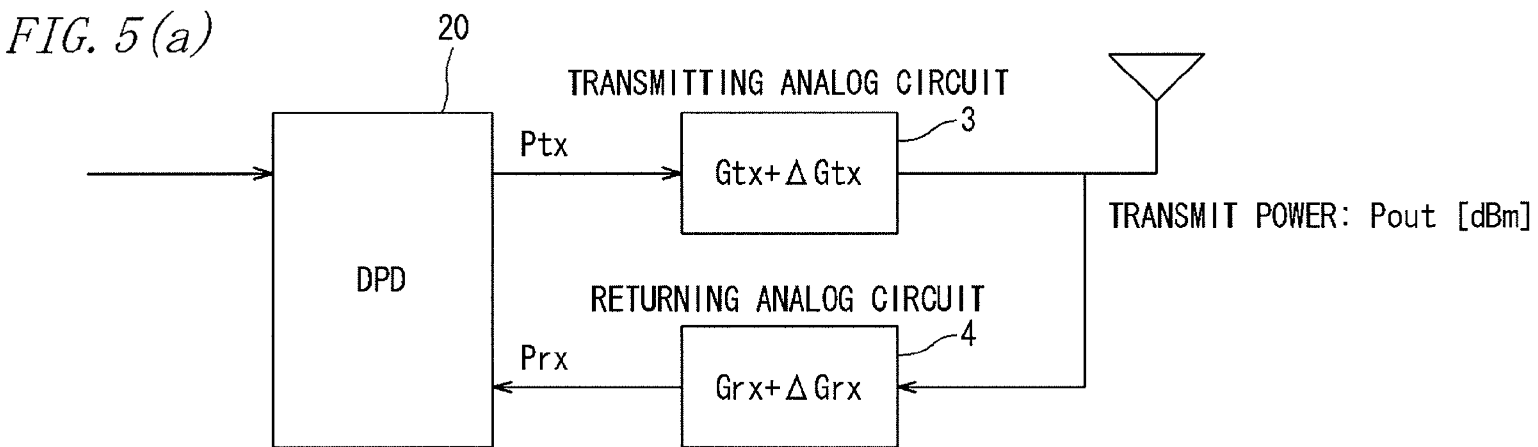

(a) of FIG. 5 is a functional block diagram of the amplifier apparatus for when the gains of both analog circuits are changed, and (b) of FIG. 5 is a table showing each power for when there is the change in gain and each power for when a distortion compensation process is performed once.

Figure 6:
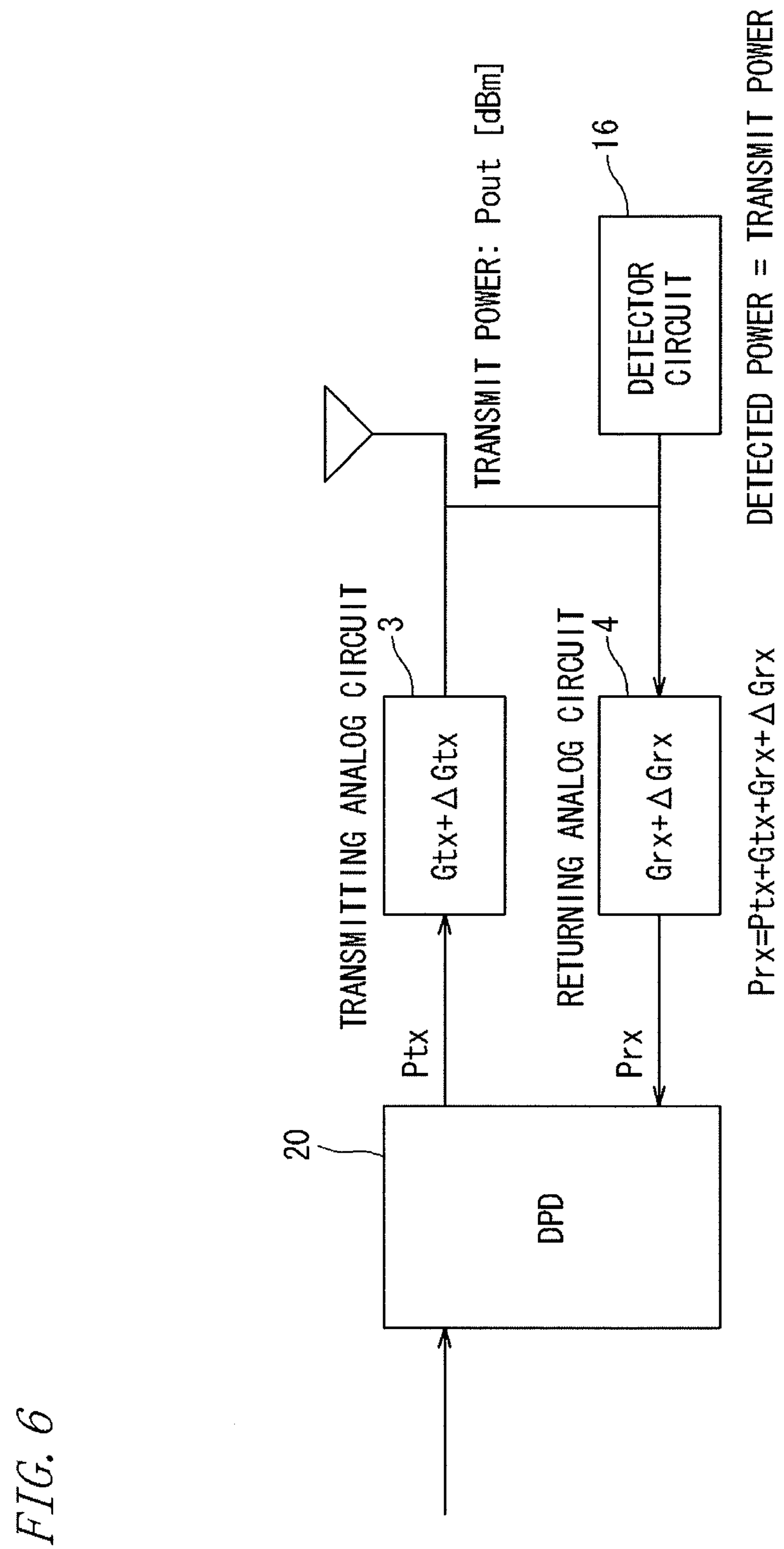

FIG. 6 is a functional block diagram of the amplifier apparatus having a detector circuit for when the gains of both analog circuits are changed.

FIG. 7 is a table showing each power for when the gains of both analog circuits are changed, and each power for when a distortion compensation process is performed twice.

Figure 8:
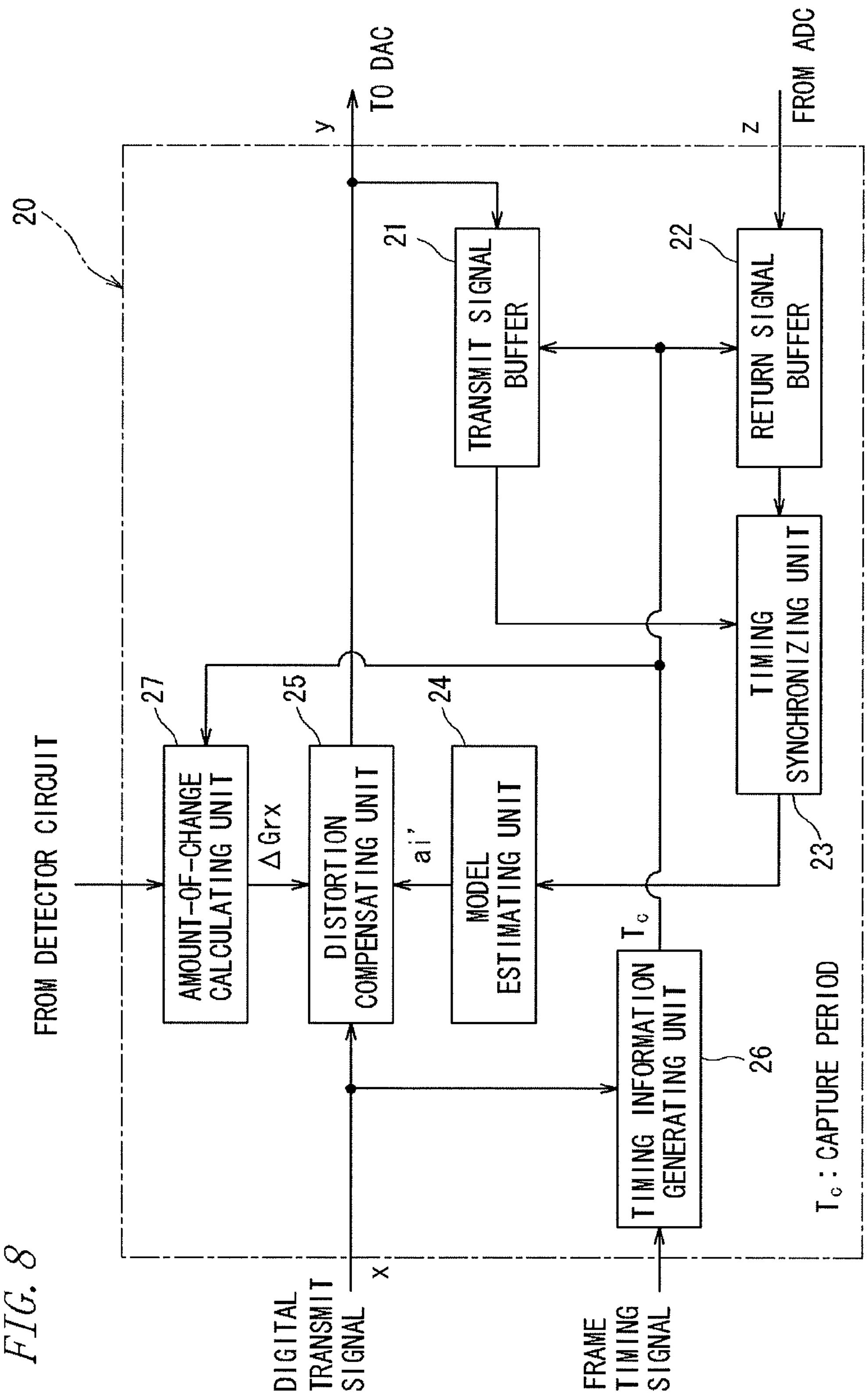

FIG. 8 is a functional block diagram of a DPD according to a second embodiment of the present invention.

Figure 9:
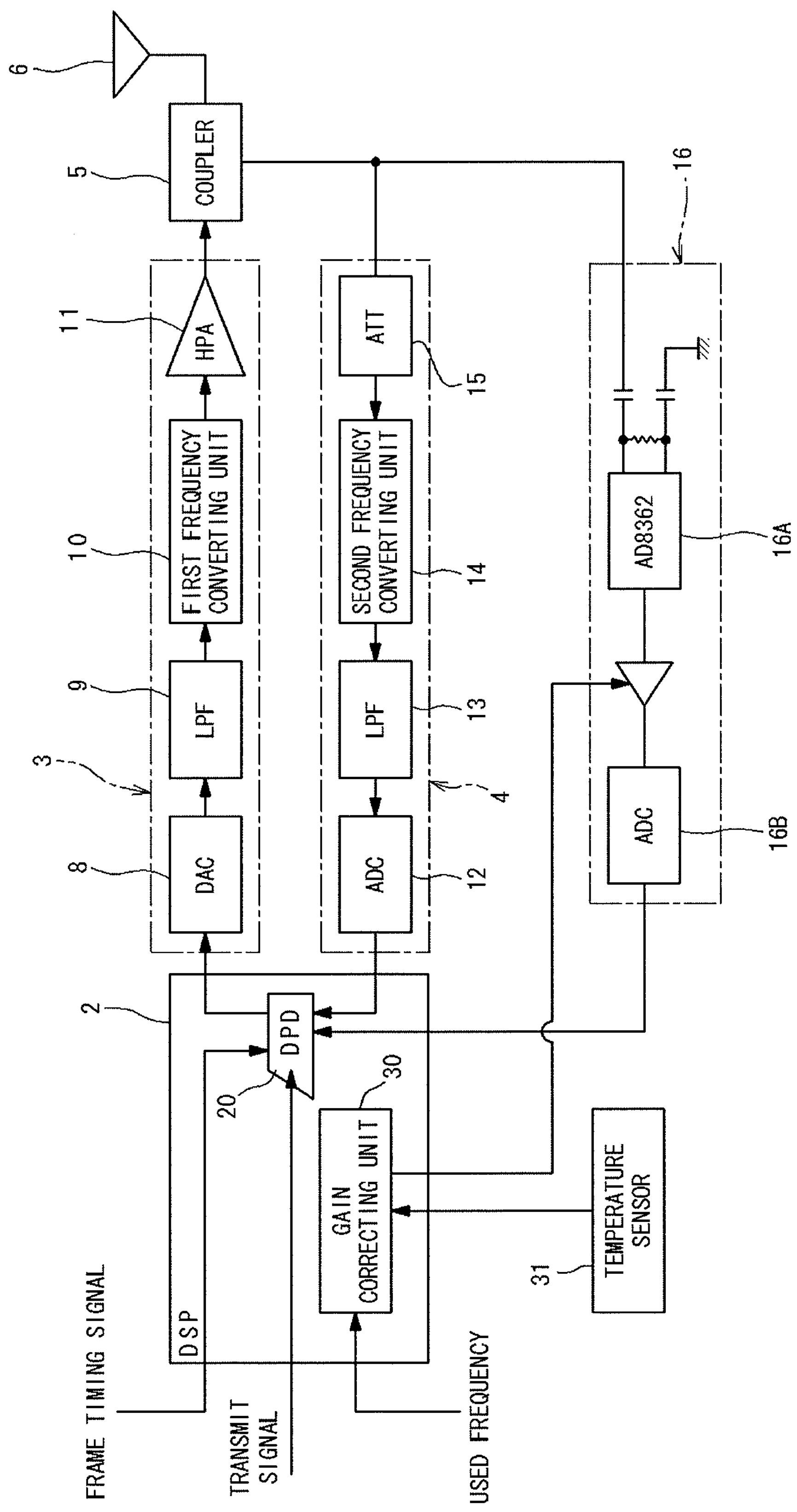

FIG. 9 is a circuit configuration diagram showing an amplifier apparatus according to a third embodiment of the present invention.

DESCRIPTION OF EMBODIMENTS

Preferred embodiments of the present invention will be described below with reference to the accompanying drawings.

First Embodiment

Configuration of an Amplifier Apparatus

Figure 1:
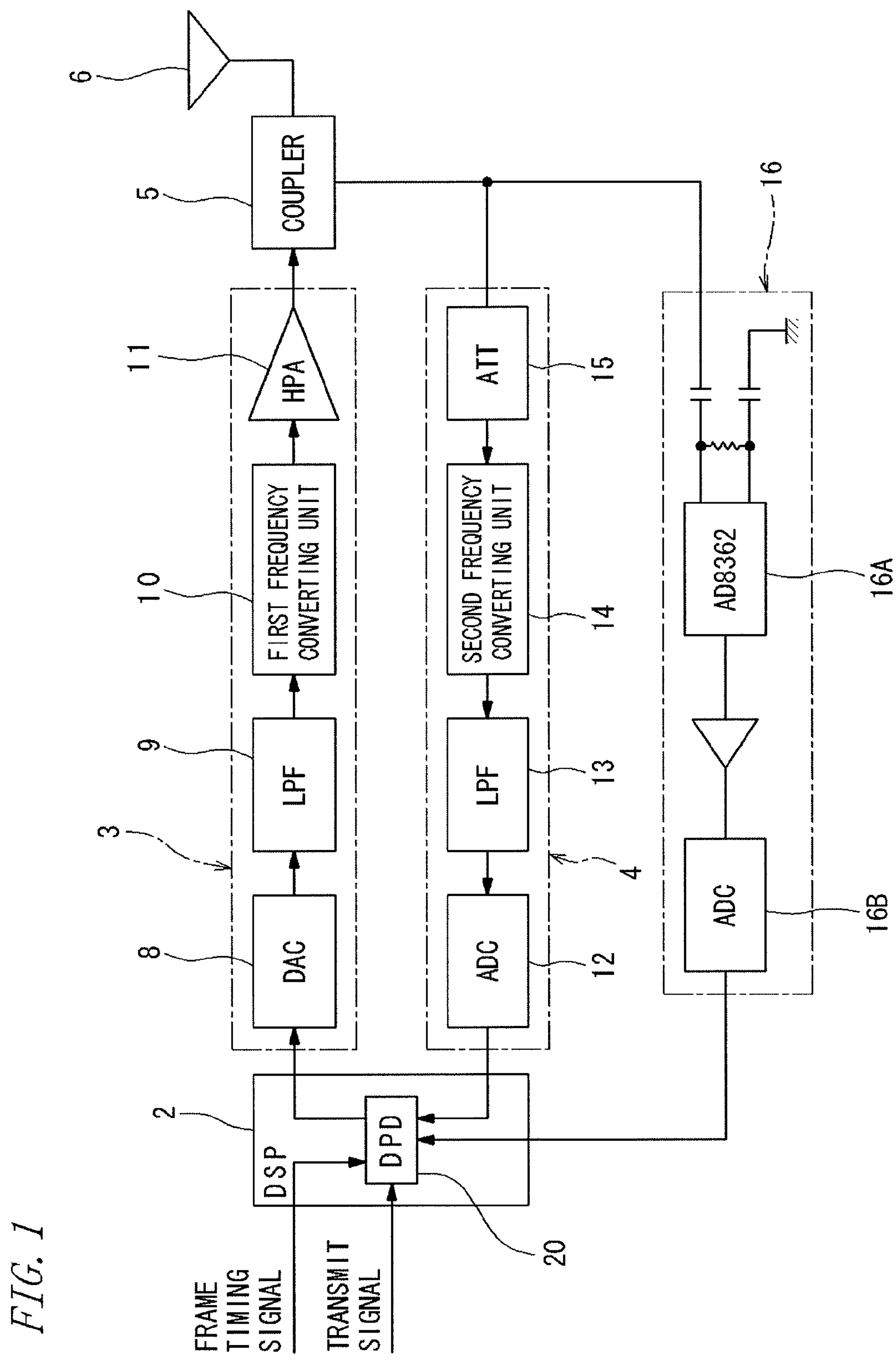
FIG. 1 is a circuit configuration diagram showing an amplifier apparatus according to a first embodiment of the present invention.

FIG. 1 is a circuit configuration diagram showing an amplifier apparatus 1 according to a first embodiment of the present invention. The amplifier apparatus 1 configures, for example, a transmission part of a base station apparatus that performs radio communication with a plurality of terminal apparatuses, and amplifies a transmit signal destined for each terminal apparatus and outputs the amplified transmit signal.

In the present embodiment, the base station apparatus is, for example, a so-called WiMAX base station apparatus compliant with IEEE802.16 which serves as a base station for a wide-area mobile radio communication system.

As shown in FIG. 1, the amplifier apparatus 1 includes a digital processing unit 2 constituted by a DSP (Digital Signal Processor), a transmitting analog circuit 3, a returning analog circuit 4, and a coupler 5.

Of them, the transmitting analog circuit 3 is disposed between the digital processing unit 2 and the coupler 5 and has, in order from the side of the processing unit 2, a D/A converter (DAC) 8, a low-pass filter (LPF) 9, a first frequency converting unit 10, and a High Power Amplifier (HPA; hereinafter, may be simply referred to as an "amplifier") 11.

The returning analog circuit 4 is disposed between the coupler 5 and the digital processing unit 2 and has, in order from the side of the processing unit 2, an A/D converter (ADC) 12, a low-pass filter (LPF) 13, a second frequency converting unit 14, and an attenuator (ATT) 15.

The digital processing unit 2 performs a predetermined signal processing including a process performed by a distortion compensation circuit 20 which will be described later, on a baseband transmit signal in digital form and outputs the processed digital signal to the transmitting analog circuit 3.

The digital output signal from the digital processing unit 2 is converted by the D/A converter 8 to an analog signal and the analog signal is up-converted by the first frequency converting unit 10 to a carrier frequency and then the signal is provided to the amplifier 11. An analog output signal from the amplifier 11 is sent to the outside from an antenna 6 through the coupler 5.

In addition, in order to perform a signal processing by the distortion compensation circuit 20, etc., the digital processing unit 2 obtains an output waveform of the amplifier 11 through the returning analog circuit 4 that converts the analog output signal from the amplifier 11 to a digital signal.

Specifically, the analog output signal from the amplifier 11 is extracted by the coupler 5 and is adjusted by the attenuator 15 to a predetermined amplitude and is down-converted by the second frequency converting unit 14 to a baseband. Thereafter, the signal is converted by the A/D converter 12 to a digital signal and the digital signal is inputted to the distortion compensation circuit 20 in the digital processing unit 2.

As shown in FIG. 1, to deal with fluctuation in gain in the returning analog circuit 4, the amplifier apparatus 1 of the present embodiment has a detector circuit 16 which is an example of electronic equipment that measures the output power (specifically, the power of a reflected signal extracted by the coupler 5) of the analog output signal from the amplifier 11.

The detector circuit 16 includes an integrated circuit for power detection 16A having an input terminal leading to the coupler 5; and an A/D converter 16B that A/D converts an output signal from the integrated circuit 16A. The integrated circuit 16A has a linear characteristic that, when a radio-frequency waveform with an arbitrary output level (dBm) is inputted to the input terminal thereof, the integrated circuit 16A outputs a detected voltage having a linear relationship with an input level thereof from an output terminal thereof.

The detected voltage (detection measured value) from the integrated circuit 16A is converted to a digital value by the A/D converter 16B at a subsequent stage thereto and is thereafter inputted to the distortion compensation circuit 20 which will be described later.

Note that as the integrated circuit 16A, for example, "AD8362" manufactured by Analog Devices, Inc. can be used.

[Configuration of the Distortion Compensation Circuit]

Figure 2:
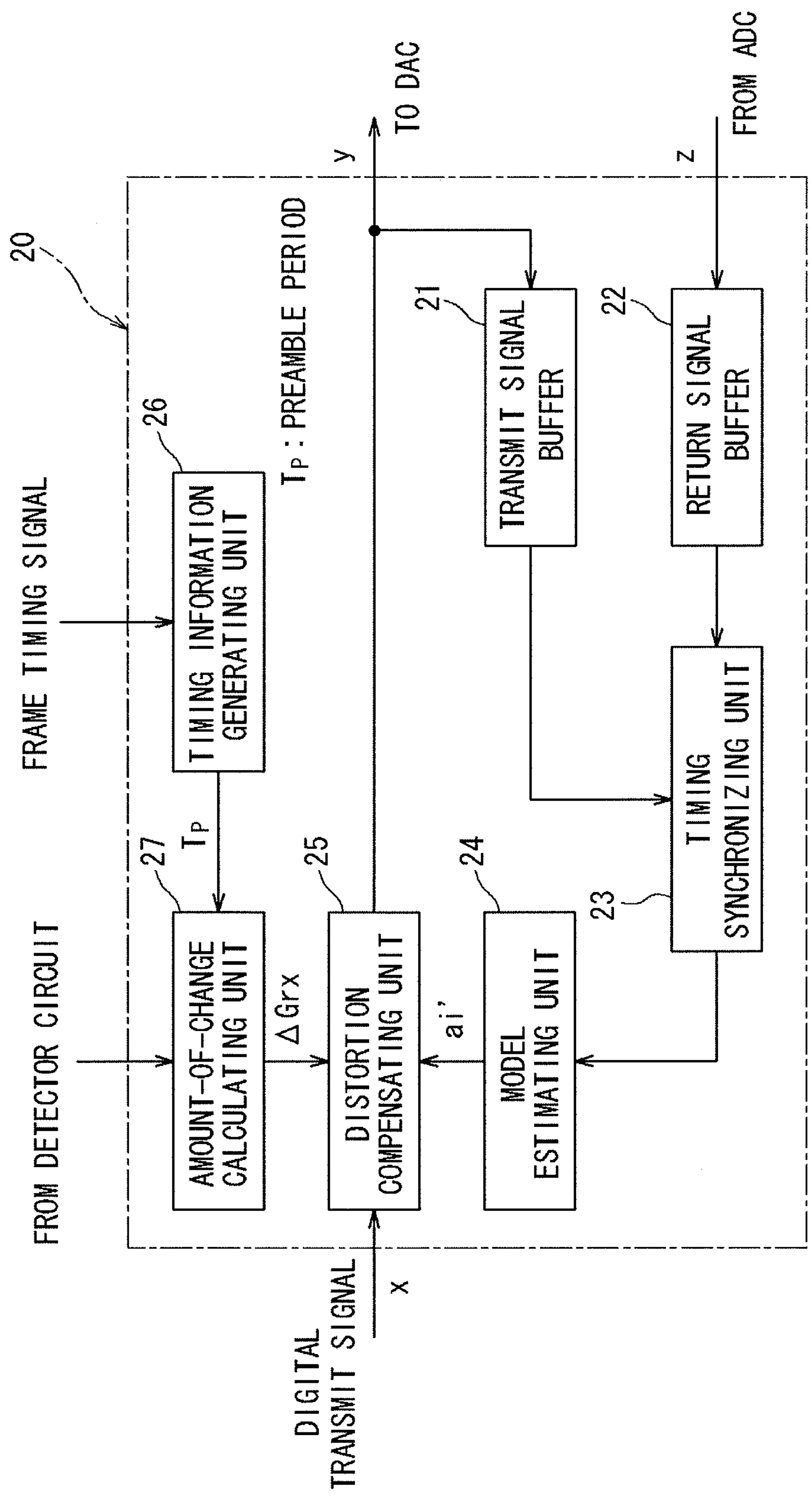
FIG. 2 is a functional block diagram of a DPD according to the first embodiment of the present invention.

FIG. 2 is a functional block diagram of the distortion compensation circuit (the DPD according to the first embodiment of the present invention) 20 functionally included in the digital processing unit 2.

The distortion compensation circuit 20 of the present embodiment includes a digital pre-distorter (DPD) of a polynomial approximation scheme that performs adaptive control by approximating the amount of distortion correction for the amplifier 11 by a polynomial and computing the coefficient values of the polynomial by digital signal processing using an input signal and an output signal to/from the amplifier 11.

As shown in FIG. 2, the DPD 20 includes a transmit signal buffer 21 that accumulates a digital transmit signal (an input signal y to the amplifier 11) to be transmitted to the DAC 8 in the transmitting analog circuit 3; a return signal buffer 22 that accumulates a digital return signal (an output signal z from the amplifier 11) obtained from the ADC 12 in the returning analog circuit 4; and a timing synchronizing unit 23 that reads the signals accumulated in the buffers 21 and 22 and allows the timings of the two signals to be synchronized with each other.

In addition, the DPD 20 includes a model estimating unit 24 that estimates an inverse model of the input-output characteristics of the amplifier 11, based on the digital signals having been subjected to the synchronization process; and a distortion compensating unit 25 that performs distortion compensation on a digital transmit signal, based on the estimated inverse model.

The transmit signal buffer 21 accumulates a portion of a digital transmit signal (an input signal y to the amplifier 11) to be transmitted to the transmitting analog circuit 3 corresponding to a sampling period which is set as a period of a predetermined time width, and outputs the accumulated signal y to the timing synchronizing unit 23.

Likewise, the return signal buffer 22 accumulates a portion of a return signal (an output signal from the amplifier 11) z from the returning analog circuit 4 corresponding to a sampling period of a predetermined time width, and outputs the accumulated signal z to the timing synchronizing unit 23.

Note that the return signal buffer 22 adjusts the timing at which the output signal z is accumulated, so as to accumulate the output signal z corresponding to the input signal y accumulated in the transmit signal buffer unit 21.

The timing synchronizing unit 23 obtains the input signal y and the output signal z included in the sampling periods which are respectively outputted from the buffers 21 and 22, and performs a synchronization process in which the timings of the input signal y and the output signal z are allowed to coincide with each other.

The distortion compensating unit 25 performs a distortion compensation process according to the input-output characteristics of the amplifier 11, on a digital transmit signal obtained before distortion compensation, and outputs a distortion-compensated digital transmit signal serving as an input signal y to the amplifier 11. Hence, the amplifier 11 can output an output signal with no distortion or with very little distortion.

Here, the input-output characteristics of the amplifier 11 are nonlinear but can be approximated by, for example, a power-series polynomial shown in the following equation (1).

Note that in equation (1) z is the output signal from the amplifier 11 (the return signal from the returning analog circuit 4), y is the input signal to the amplifier 11, and ai is the coefficient of each order i.

$$z = \sum_i a_i \cdot y^i \quad \text{[Equation 1]}$$

The distortion compensating unit 25 computes, based on the above-described equation (1), a power-series polynomial shown in the following equation (2) and determines an input signal y (a signal to be outputted to the transmitting analog circuit 3) to the amplifier 11.

Note that in equation (2) ai' is the coefficient of each order i indicating an inverse characteristic of the amplifier 11.

$$y = \sum_i a_i' \cdot x^i \quad \text{[Equation 2]}$$

As shown in the above-described equation (2), the distortion compensating unit 25 performs distortion compensation by adding a characteristic inverse to the distortion characteristic of the amplifier 11 to a digital transmit signal x obtained before distortion compensation, based on the coefficient ai' of each order i indicating an inverse characteristic of the amplifier 11, to cancel out distortion caused by the amplifier 11.

The coefficient ai' indicating the inverse characteristic of the amplifier 11 in the above-described equation (2) is determined by the model estimating unit 24. The model estimating unit 24 reads data of the input signal y and the output signal z to/from the amplifier 11 which are provided from the timing synchronizing unit 23 and estimates, based on the data, a model representing the input-output characteristics of the amplifier 11 and thereby determines a coefficient ai' of each order i.

Specifically, the model estimating unit 24 has an inverse model of the amplifier 11 where the input signal y to the amplifier 11 is represented by a power-series polynomial of the output signal z therefrom, and applies the input and output signals provided from the timing synchronizing unit 23 to the model and thereby estimates the inverse model.

The model estimating unit 24 outputs the coefficient of each order indicating the estimated inverse model to the distortion compensating unit 25 as the coefficient ai' of each order i indicating the inverse characteristic of the amplifier 11.

The DPD 20 of the present embodiment further includes a timing information generating unit 26 and an amount-of-change calculating unit 27.

Of them, the amount-of-change calculating unit 27 obtains a detected voltage (measured value) of the detector circuit 16 only for a predetermined period, and calculates output power (average power) of the amplifier 11 from the measured value and calculates, based on the output power, the amount of change ΔGrx in the gain Grx of the returning analog circuit 4.

The timing information generating unit 26 obtains a timing signal of a transmit frame from a signal processing unit (not shown) on the higher layer side and creates, based on the timing signal, a period during which a measured value of the detector circuit 16 is obtained and instructs the amount-of-change calculating unit 27 of the period.

Specifically, the timing information generating unit 26 of the present embodiment determines a preamble period Tp that advances by the time width of a preamble portion from the start of a transmit frame, and notifies the amount-of-change calculating unit 27 of the period Tp. The amount-of-change calculating unit 27 having received the notification obtains a measured value of the detector circuit 16 during the notified preamble period Tp.

Therefore, in the DPD 20 of the present embodiment, the amount-of-change calculating unit 27 is configured to calculate the amount of change ΔGrx in the gain Grx of the returning analog circuit 4, using a portion of a transmit frame corresponding to a preamble which is a known signal pattern.

In the case where the amount-of-change calculating unit 27 has calculated the amount of change ΔGrx, then the amount-of-change calculating unit 27 notifies the distortion compensating unit 25 of the calculated amount of change ΔGrx.

Note that the distortion compensating unit 25 performs a distortion compensation process based on the notified amount of change ΔGrx and thereby corrects fluctuation in the gain of the returning analog circuit 4. The correction process will be described later.

Note also that the amount-of-change calculating unit 27 of the present embodiment is configured to perform an averaging process of measured values of the detector circuit 16 during the preamble period Tp. By this, noise measurement error is suppressed, making it possible to accurately calculate the amount of change ΔGrx in the gain Grx of the returning analog circuit 4.

Note that in this case by performing an averaging process over preamble periods Tp of a plurality of transmit frames, noise measurement error can be more effectively suppressed over the case of performing an averaging process during a preamble period Tp of a single transmit frame.

[Power Control by the DPD]

(a) of FIG. 3 is a functional block diagram of the amplifier apparatus 1 for showing power control performed by the DPD 20, and (b) of FIG. 3 is a table showing each power in an initial state with no fluctuation in gain.

In FIG. 3, Ptx (dB) is the power of an output signal (digital transmit power) from the DPD 20, Prx (dB) is the power of an input signal (digital return power) to the DPD 20, and Pout (dBm) is analog transmit power outputted from the amplifier 11.

In addition, in FIG. 3, Gtx (dB) is the gain of the transmitting analog circuit 3 (the gain of the amplifier 11), Grx (dB) is the gain of the returning analog circuit 4 (the gain of the attenuator 15), Tout is the target value of the transmit power Pout, and Trx is the target value of the digital return power Prx.

Here, a distortion compensation process by the DPD 20 is equivalent, when viewed from the point of view of power control, to controlling the digital transmit power Ptx such that the digital return power Prx reaches its target value Trx (=Tout+Grx).

Such control of the digital transmit power Ptx is performed according to the amplitude and frequency of a digital transmit signal which is an output signal from the DPD 20.

In addition, the following equality is established between the above-described powers Ptx, Prx, and Pout and gains Gtx and Grx:

$$Prx = Pout + Grx = Ptx + Gtx + Grx$$

As shown in (b) of FIG. 3 in the initial state with no change in the gains Gtx and Grx of the analog circuits 3 and 4, the DPD 20 controls the digital transmit power Ptx such that the digital return power Prx reaches Trx (=Tout+Grx), in order to allow the transmit power Pout to coincide with the target value Tout. Therefore, the digital transmit power Ptx becomes as follows:

$$\begin{aligned} Ptx &= Prx - (Gtx + Grx) \\ &= (Tout + Grx) - (Gtx + Grx) \\ &= Tout - Gtx \end{aligned}$$

Next, (a) of FIG. 4 is a functional block diagram of the amplifier apparatus 1 for when the gain Gtx of the transmitting analog circuit 3 is changed, and (b) of FIG. 4 is a table showing each power for when there is the change in gain and each power for when a distortion compensation process is performed once.

In this case, given that the amount of change in the gain Gtx of the transmitting analog circuit 3 is ΔGtx, the gain of the transmitting analog circuit 3 is Gtx→Gtx+ΔGtx.

In addition, in this case, the digital return power Prx and the transmit power Pout increase by an amount corresponding to the amount of change in transmit gain ΔGtx.

Specifically, when the transmit gain is changed to Gtx+ΔGtx, as shown in (b) of FIG. 4, the digital return power Prx and the transmit power Pout become as follows:

$$Prx = Tout + \Delta Gtx + Grx$$

$$Pout = Tout + \Delta Gtx$$

In this case, since the DPD 20 performs a distortion compensation process such that the digital return power Prx reaches its target value Trx (=Tout+Gtx), the digital transmit power Ptx and the transmit power Pout after the process become as follows:

$$\begin{aligned} Ptx &= Prx - (Gtx + \Delta Gtx + Grx) \\ &= (Tout + Grx) - (Gtx + \Delta Gtx + Grx) \\ &= Tout - Gtx - \Delta Gtx \end{aligned}$$

$$\begin{aligned} Pout &= Ptx + (Gtx + \Delta Gtx) \\ &= Tout \end{aligned}$$

As such, even if the gain Gtx of the transmitting analog circuit 3 is changed, by performing a distortion compensation process once by the DPD 20, the transmit power Pout can be allowed to coincide with its target value Tout.

Namely, the fluctuation ΔGtx in transmit gain Gtx can be dealt with by a distortion compensation process by the DPD 20.

[Problem for when the Return Gain is Changed]

Meanwhile, (a) of FIG. 5 is a functional block diagram of the amplifier apparatus 1 for when the gains Gtx and Grx of both of the analog circuits 3 and 4 are changed, and (b) of FIG. 5 is a table showing each power for when there is the change in gain and each power for when a distortion compensation process is performed once.

In this case, given that the amount of change in the gain Gtx of the transmitting analog circuit 3 is ΔGtx and the amount of change in the gain Grx of the returning analog circuit 4 is ΔGrx, the gain of the transmitting analog circuit 3 is Gtx→Gtx+ΔGtx and the gain of the returning analog circuit 4 is Grx→Grx+ΔGrx.

In addition, in this case, the digital return power Prx and the transmit power Pout increase by an amount corresponding to the amount of change in transmit gain ΔGtx and the digital return power Prx increases by an amount corresponding to the amount of change in return gain ΔGrx.

Namely, when the transmit gain is changed to Gtx+ΔGtx and the return gain is changed to Grx+ΔGrx, the digital return power Prx and the transmit power Pout become as follows:

$$Prx = Tout + \Delta Gtx + Grx + \Delta Grx$$

$$Pout = Tout + \Delta Gtx$$

In this case, since the DPD 20 performs a distortion compensation process such that the digital return power Prx reaches its target value Trx (=Tout+Gtx), the digital transmit power Prx and the transmit power Pout after the process become as follows:

$$\begin{aligned} Ptx &= Prx - (Gtx + \Delta Gtx + Grx + \Delta Grx) \\ &= (Tout + Grx) - (Gtx + \Delta Gtx + Grx + \Delta Grx) \\ &= Tout - Gtx - \Delta Gtx - \Delta Grx \end{aligned}$$

$$\begin{aligned} Pout &= Ptx + (Gtx + \Delta Gtx) \\ &= Tout - \Delta Grx \end{aligned}$$

As such, when the gain Grx of the returning analog circuit 4 is changed, performing only a distortion compensation process by the DPD 20 results in that the fluctuation ΔGrx in return gain Grx remains in the digital transmit power Prx and the transmit power Pout, and thus the transmit power Pout cannot be allowed to coincide with its target value Tout.

Namely, the fluctuation ΔGtx in transmit gain Gtx can be corrected only by a distortion compensation process by the DPD 20, but the fluctuation ΔGrx in return gain Grx cannot be corrected only by a distortion compensation process by the DPD 20.

[Solving Method Using the Detector Circuit]

Hence, in the present embodiment, the amount-of-change calculating unit 27 calculates the transmit power (average power) Pout of the amplifier 11 from a measured value of the detector circuit 16 and updates the target value Trx of the digital return power Prx, using the amount of change ΔGrx in return gain Grx which is calculated based on the output power, whereby even if the return gain Grx fluctuates, the transmit power Pout is allowed to coincide with the target value Tout.

FIG. 6 is a functional block diagram of the amplifier apparatus 1 having the detector circuit 16 for when the gains Gtx and Grx of both of the analog circuits 3 and 4 are changed. FIG. 7 is a table showing each power for when the gains Gtx and Grx of both of the analog circuits 3 and 4 are changed, and each power for when a distortion compensation process is performed twice.

With reference to FIGS. 6 and 7, the steps of a process of correcting the return gain Grx which is performed by the DPD 20 of the present embodiment will be described below.

1) As shown in the third row of the table of FIG. 7, first, the distortion compensating unit 25 in the DPD 20 performs the first distortion compensation process in order to erase the amount of change ΔGtx in transmit gain Gtx from the transmit power Pout.

In this case, as described above, the transmit power Pout=Tout−ΔGrx and the amount of change ΔGrx in return gain Grx remains in the transmit power Pout.

2) When the first distortion compensation process is performed, the amount-of-change calculating unit 27 in the DPD 20 calculates the amount of change ΔGrx in return gain Grx based on the transmit power of the amplifier 11 which is obtained from a measured value of the detector circuit 16 during a preamble period Tp of a transmit frame, and transmits the amount of change ΔGrx to the distortion compensating unit 25.

The distortion compensating unit 25 having received the amount of change ΔGrx adds the amount of change ΔGrx to the target value Trx of the digital return power Prx and thereby changes the target value Trx from Tout+Grx to Tout+Grx+ΔGrx.

3) Then, as shown in the fifth row of the table of FIG. 7, the distortion compensating unit 25 in the DPD 20 performs the second distortion compensation process using the changed Trx (=Tout+Grx+ΔGrx).

At this time, the digital transmit power Ptx and the transmit power Pout after the process become as follows:

$$\begin{aligned} Ptx &= Prx - (Gtx + \Delta Gtx + Grx + \Delta Grx) \\ &= (Tout + Grx + \Delta Grx) - (Gtx + \Delta Gtx + Grx + \Delta Grx) \\ &= Tout - Gtx - \Delta Gtx \end{aligned}$$

$$\begin{aligned} Pout &= Ptx + (Gtx + \Delta Gtx) \\ &= Tout \end{aligned}$$

As such, according to the DPD 20 of the present embodiment, the amount of change ΔGrx in return gain Grx is determined from a measured value of the detector circuit 16 and the target value Trx of the digital return power Prx is changed by the amount of fluctuation ΔGrx and then a distortion compensation process is performed, whereby even if the gain Grx of the returning analog circuit 4 is changed, the transmit power Pout can be allowed to coincide with the target value Tout.

Hence, even if the return gain Grx fluctuates due to deterioration over time or changes in temperature, a distortion compensation process by the DPD 20 can be accurately performed.

In addition, according to the DPD 20 of the present embodiment, the amount of change ΔGtx in transmit gain Gtx is erased by the first distortion compensation process and then the return gain Grx is corrected by the second distortion compensation process. Thus, even if there is gain fluctuation in both of the analog circuits 3 and 4, the gains can be corrected by distortion compensation processes by the DPD 20.

Second Embodiment

FIG. 8 is a functional block diagram of a DPD 20 according to a second embodiment of the present invention.

The DPD 20 of the present embodiment (FIG. 8) differs from that of the first embodiment (FIG. 2) in that in order that a process of correcting a return gain Grx can be performed using any portion of a transmit frame instead of a preamble portion of the transmit frame, a distortion compensation process is performed using a capture signal whose maximum amplitude is greater than or equal to a predetermined value.

Specifically, a timing information generating unit 26 of the present embodiment obtains a timing signal of a transmit frame from a signal processing unit (not shown) on the higher layer side and periodically creates a sampling period which is repeated in synchronization with the timing signal.

In addition, the timing information generating unit 26 obtains a digital transmit signal included in a created sampling period and determines whether the transmit signal includes a data pattern with a maximum amplitude at which the amplifier 11 becomes nonlinear, or greater than the maximum amplitude.

If the result of the above-described determination is negative, then the timing information generating unit 26 continues obtaining of a digital transmit signal during the next and subsequent sampling periods. If, on the other hand, the result of the above-described determination is positive, then the timing information generating unit 26 notifies each of buffers 21 and 22 and an amount-of-change calculating unit 27 of a sampling period during which the data pattern is captured (hereinafter, referred to as a "capture period Tc").

The buffers 21 and 22 respectively accumulate an input signal y and an output signal z obtained during the capture period Tc notified from the timing information generating unit 26, and a distortion compensation process is performed on a capture signal accumulated during the capture period Tc.

The amount-of-change calculating unit 27 obtains a measured value of a detector circuit 16 during the capture period Tc notified from the timing information generating unit 26, calculates the amount of change ΔGrx of gain Grx in a returning analog circuit 4 using a measured value for a capture signal obtained during the period Tc, and notifies a distortion compensating unit 25 of the calculated amount of change ΔGrx.

In the present embodiment, too, as in the case of the first embodiment, by performing two distortion compensation processes by the DPD 20 (the above-described steps 1) to 3)), the return gain Grx can be corrected.

Note that in the present embodiment since arbitrary transmit data whose signal pattern is unknown is used, not only the second distortion compensation process in which the return gain Grx is corrected but also the first distortion compensation process in which the amount of change ΔGtx in transmit gain Gtx is erased is performed on a capture signal which is transmit data obtained during a capture period Tc determined by the timing information generating unit 26.

As such, in the DPD 20 of the present embodiment, the timing information generating unit 26 determines a capture signal whose maximum amplitude is greater than or equal to a predetermined value during a predetermined sampling period, and the amount-of-change calculating unit 27 calculates the amount of change ΔGrx in the gain Grx of the returning analog circuit 4 using a measured value of the detector circuit 16 corresponding to the capture signal. Therefore, without using a known signal pattern such as a preamble portion, a process of correcting the return gain Grx can be performed.

Hence, the present invention can be applied even in the case of a base station apparatus compliant with a standard that does not include a preamble portion, e.g., LTE (Long Term Evolution).

Third Embodiment

FIG. 9 is a circuit configuration diagram showing an amplifier apparatus according to a third embodiment of the present invention.

An amplifier apparatus 1 of the present embodiment (FIG. 9) differs from that of the first embodiment (FIG. 1) in that a digital processing unit 2 has the function of compensating for error in the gain of a detector circuit 16 caused by fluctuation in ambient temperature or used frequency.

Specifically, in the amplifier apparatus 1 of the present embodiment, the digital processing unit 2 includes a gain correcting unit 30 that corrects the gain of the detector circuit 16, based on the ambient temperature of the detector circuit 16 and the used frequency of an analog transmit signal (RF signal).

The gain correcting unit 30 obtains at all times a detected value of a temperature sensor 31 that measures the ambient temperature of the detector circuit 16, and obtains a used frequency of an RF signal which is currently used, from a signal processing unit (not shown) on the higher layer side.

In addition, a memory of the digital processing unit 2 stores, for example, a "temperature gain table" and a "frequency gain table" such as those exemplified below which show the amounts of correction of the gain of the detector circuit 16 for temperature and frequency.

(Example of the Temperature Gain Table)

10° C./Output −1 dB

20° C./Output 0 dB

30° C./Output 1 dB (Example of the Frequency Gain Table)

2.5 GHz/Output −1 dB 2.6 GHz/Output 0 dB 2.7 GHz/Output 1 dB

Hence, the gain correcting unit 30 corrects the gain of an amplifier of the detector circuit 16 by referring to each of the gain tables according to the detected value obtained from the temperature sensor 31 and the used frequency obtained from the higher layer.

Specifically, in the case of a used frequency of 2.6 GHz, when the output from the detector circuit 16 at an ambient temperature of 10° C. is X dBm, the gain correcting unit 30 corrects the gain of the amplifier of the detector circuit 16 such that the output is (X−1) dBm.

In the case of a used frequency of 2.6 GHz, when the output from the detector circuit 16 at an ambient temperature of 30° C. is X dBm, the gain correcting unit 30 corrects the gain of the amplifier of the detector circuit 16 such that the output is (X+1) dBm.

Furthermore, for example, when the output from the detector circuit 16 at a transmit frequency of 2.7 GHz and at an ambient temperature of 30° C. is X dBm, the gain correcting unit 30 corrects the gain of the amplifier of the detector circuit 16 such that the output is (X+2) dBm.

As such, according to the amplifier apparatus 1 of the present embodiment, since the gain correcting unit 30 corrects the gain of the amplifier of the detector circuit 16 based on the ambient temperature of the detector circuit 16 and the used frequency of an RF signal, even if the ambient temperature or used frequency fluctuates, a measured value of the detector circuit 16 can be maintained with high accuracy and thus a process of correcting a return gain Grx can be accurately performed.

In addition, according to the amplifier apparatus 1 of the present embodiment, since it is sufficient to control only the gain of the amplifier of the detector circuit 16, there is an advantage in that control of temperature compensation and frequency compensation is facilitated.

Specifically, assuming the case in which temperature compensation and frequency compensation are performed on each of analog circuits 3 and 4 without using the detector circuit 16, although there is a need to hold, for each of a power amplifier 11, an attenuator 15, mixers 10 and 14, filters 9 and 13, etc., gain tables according to the ambient temperature thereof and the used frequency, and compensate for error in the gain of each of the analog circuits 3 and 4, in the present invention, a transmit gain Gtx and a return gain Grx can be corrected using a measured value of the detector circuit 16, and thus it only needs to compensate for error in the gain of the detector circuit 16 and hence it is sufficient to hold only gain tables for the detector circuit 16.

Note that although in the third embodiment the gain correcting unit 30 corrects the gain of the detector circuit 16 based on both the ambient temperature of the detector circuit 16 and the used frequency of the RF signal, the gain may be corrected based on only one of the ambient temperature and the used frequency.

[Other Variants]

The above-described embodiments are illustrative of and not restrictive on the present invention. The scope of the present invention is indicated by the claims rather than by the above-described embodiments, and includes all changes that come within the range and configuration of equivalency of the claims.

For example, although in the above-described embodiments the amount of change ΔGrx in return gain Grx is calculated and then the return gain Grx is corrected by the second distortion compensation process, the return gain may be corrected by adjusting the attenuator 15 in the returning analog circuit 4.

Furthermore, although in the above-described embodiments the DPD 20 of a polynomial approximation scheme is adopted, the present invention can also be applied in the case of a DPD of a LUT scheme.

REFERENCE SIGNS LIST

1: AMPLIFIER APPARATUS
2: DIGITAL PROCESSING UNIT
3: TRANSMITTING ANALOG CIRCUIT
4: RETURNING ANALOG CIRCUIT
5: COUPLER
8: D/A CONVERTER
9: LOW-PASS FILTER
10: FIRST FREQUENCY CONVERTING UNIT
11: HIGH POWER AMPLIFIER
12: A/D CONVERTER
13: LOW-PASS FILTER
14: SECOND FREQUENCY CONVERTING UNIT
15: ATTENUATOR
16: DETECTOR CIRCUIT (POWER MEASUREMENT CIRCUIT)
20: DISTORTION COMPENSATION CIRCUIT (DPD)
27: AMOUNT-OF-CHANGE CALCULATING UNIT

The invention claimed is:

1. An amplifier apparatus including an amplifier and a digital pre-distorter (hereinafter, referred to as "DPD" in the claims) that performs a distortion compensation process of the amplifier, the amplifier apparatus comprising:

a transmitting analog circuit that converts a digital output signal from the DPD to an analog signal, up-converts the analog signal, and inputs the analog signal to the amplifier, the transmitting analog circuit including the amplifier;

a returning analog circuit that adjusts an analog output signal from the amplifier to a predetermined amplitude, down-converts the analog output signal to a digital signal, and inputs the digital signal to the DPD; and a power measurement circuit that measures output power of the analog output signal from the amplifier, wherein a measured value of the power measurement circuit is inputted to the DPD.

2. The amplifier apparatus according to claim 1, wherein the DPD corrects a gain of the returning analog circuit, based on an input value from the returning analog circuit and the measured value of the power measurement circuit.

3. The amplifier apparatus according to claim 1, wherein the DPD includes an amount-of-change calculating unit that calculates an amount of change in a gain of the returning analog circuit, based on the measured value of the power measurement circuit, and the DPD corrects the gain of the returning analog circuit, based on an input value from the returning analog circuit and the amount of change in the gain of the returning analog circuit.

4. The amplifier apparatus according to claim 3, wherein the DPD performs a first distortion compensation process not taking into account the amount of change in the gain of the returning analog circuit, and thereafter performs a second distortion compensation process taking into account the amount of change in the gain of the returning analog circuit, and thereby corrects the gain.

5. The amplifier apparatus according to claim 3, wherein the amount-of-change calculating unit calculates the amount of change in the gain of the returning analog circuit, using a measured value of the power measurement circuit for a known signal pattern.

6. The amplifier apparatus according to claim 3, wherein the amount-of-change calculating unit performs an averaging process of measured values of the power measurement circuit during a period during which the known signal pattern is transmitted.

7. The amplifier apparatus according to claim 6, wherein the amount-of-change calculating unit performs the averaging process over periods during which the signal patterns of a plurality of transmit frames are transmitted.

8. The amplifier apparatus according to claim 3, wherein the amount-of-change calculating unit calculates the amount of change in the gain of the returning analog circuit, using a measured value of the power measurement circuit for a capture signal whose maximum amplitude is greater than or equal to a predetermined value, the capture signal being captured during a predetermined sampling period.

9. The amplifier apparatus according to claim 1, further comprising a gain correcting unit that corrects a gain of the power measurement circuit, based on either or both of an ambient temperature of the power measurement circuit and a used frequency of a transmit signal.

10. A radio transmitting apparatus comprising an amplifier apparatus according to claim 1.

11. A method of adjusting a gain of an amplifier apparatus having a DPD, the method comprising the steps of:

measuring output power of an amplifier;

calculating an amount of change in a gain of a returning analog circuit disposed at a subsequent stage to the DPD, based on the measured output power of the amplifier; and correcting the gain of the returning analog circuit, based on an input value to the DPD from the returning analog circuit and the calculated amount of change.

* * * * *